United States Patent
Mao et al.

(10) Patent No.: US 8,318,529 B1
(45) Date of Patent: Nov. 27, 2012

(54) LASER ANNEAL FOR IMAGE SENSORS

(75) Inventors: Duli Mao, Sunnyvale, CA (US);
Hsin-Chih Tai, San Jose, CA (US);
Vincent Venezia, Sunnyvale, CA (US);
Yin Qian, Milpitas, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/566,638

(22) Filed: Aug. 3, 2012

Related U.S. Application Data

(62) Division of application No. 12/768,319, filed on Apr. 27, 2010, now Pat. No. 8,278,690.

(51) Int. Cl.
*H01L 21/00* (2006.01)

(52) U.S. Cl. ............ 438/73; 438/72; 438/550; 438/799; 257/E31.127

(58) Field of Classification Search .............. 438/72, 438/73, 799, 550; 257/E31.127
See application file for complete search history.

(56) References Cited

U.S. PATENT DOCUMENTS

| | | | |
|---|---|---|---|
| 5,514,880 A * | 5/1996 | Nishimura et al. | 257/70 |
| 5,688,715 A | 11/1997 | Sexton et al. | |
| 5,911,106 A | 6/1999 | Tasaka | |
| 6,019,796 A | 2/2000 | Mei et al. | |
| 6,124,179 A | 9/2000 | Adamic, Jr. | |
| 7,952,096 B2 | 5/2011 | Rhodes | |
| 2001/0044175 A1 | 11/2001 | Barrett et al. | |
| 2002/0006694 A1 | 1/2002 | Kawahara | |
| 2004/0089892 A1 * | 5/2004 | Suzuki | 257/302 |
| 2006/0006488 A1 | 1/2006 | Kanbe | |
| 2006/0038206 A1 | 2/2006 | Shimoyama et al. | |
| 2007/0207566 A1 | 9/2007 | Fu et al. | |
| 2009/0096049 A1 | 4/2009 | Oshiyama et al. | |
| 2009/0200587 A1 | 8/2009 | Venezia et al. | |

(Continued)

FOREIGN PATENT DOCUMENTS

WO      WO/94/14188      6/1994

OTHER PUBLICATIONS

Samesh Ima, T. et al., "Improvement of SiO2 Properties and Silicon Surface Passivation by Heat Treatment with High-Pressure H2O Vapor", Japan Journal of Applied Physics, vol. 37, Part 2, No. 12A, Dec. 1, 1998, pp. L1452-L1454, Japan Journal of Applied Physics Publication Board, Japan.

(Continued)

*Primary Examiner* — Matthew Reames
(74) *Attorney, Agent, or Firm* — Blakely Sokoloff Taylor & Zafman LLP

(57) ABSTRACT

A technique for fabricating an image sensor including a pixel circuitry region and a peripheral circuitry region includes fabricating front side components on a front side of the image sensor. A dopant layer is implanted on a backside of the image sensor. A anti-reflection layer is formed on the backside and covers a first portion of the dopant layer under the pixel circuitry region while exposing a second portion of the dopant layer under the peripheral circuitry region. The first portion of the dopant layer is laser annealed from the backside of the image sensor through the anti-reflection layer. The anti-reflection layer increases a temperature of the first portion of the dopant layer during the laser annealing.

13 Claims, 8 Drawing Sheets

U.S. PATENT DOCUMENTS

2009/0230489 A1     9/2009   Ando
2010/0159632 A1     6/2010   Rhodes et al.

OTHER PUBLICATIONS

Takato, H. et al., "Surface Passivation Effect of Silicon Substrates due to Quinhydrone/Ethanol Treatment", Japan Journal of Applied Physics, vol. 40, Part 2, No. 10A, Oct. 1, 2001, pp. L1003-L1004,The Japan Society of Applied Physics, Japan.

Schmidt, J. et al., "Surface passivation of silicon solar cells using plasma-enhanced chemical-vapor-deposited SiN films and thin thermal SiO2/plasma SiN stacks", Semiconductor Science and Technology, vol. 16, 2001, pp. 164-170, Institute of Physics Publishing, United Kingdom.

Kurita, K. et al., "Low Surface Recombination Velocity on Silicon Water Surfaces due to Iodine-Ethanol Treatment", Japanese Journal of Applied Physics, vol. 38, Part 1, No. 10, Oct. 1999, pp. 5710-5714, Japan Journal of Applied Physics Publication Board, Japan.

U.S. Appl. No. 12/768,319—Restriction Requirement Office Action, mailed Nov. 28, 2011 (6 pages).

U.S. Appl. No. 12/768,319—Non-Final Office Action, mailed Jan. 25, 2012 (10 pages).

U.S. Appl. No. 12/768,319—Final Office Action, mailed Jun. 19, 2012 (6 pages).

\* cited by examiner

LASER ANNEAL FOR IMAGE SENSORS

CROSS-REFERENCE TO RELATED APPLICATIONS

This application is a divisional of co-pending U.S. application Ser. No. 12/768,319, filed on Apr. 27, 2010, the contents of which are hereby incorporated by reference.

TECHNICAL FIELD

This disclosure relates generally to image sensors, and in particular but not exclusively, relates to backside illuminated CMOS image sensors.

BACKGROUND INFORMATION

FIG. 1 illustrates a conventional backside illuminated ("BSI") image sensor 100 including pixel circuitry 101 and peripheral circuitry 102. Pixel circuitry 101 includes a photodiode ("PD") region 105 disposed within a silicon P type epitaxial ("epi") layer 110. Transistor pixel circuitry is at least partially formed in or on a P well 115. For the sake of clarity and so as not to clutter the drawings, only the transfer transistor (T1) and reset transistor (T2) of pixel circuitry 101 are illustrated. A first metal layer M1 for coupling to the gates of the transfer and reset transistors is disposed within an interlayer dielectric layer 120.

Peripheral circuitry 102 is also disposed in or on epi layer 110, and may function as control circuitry, readout circuitry, logic circuitry, dark current reference cells, or the like. Peripheral circuitry is defined as any complementary metal-oxide semiconductor (CMOS) device that is not part of pixel circuitry 101. In FIG. 1, pixel circuitry 101 is illustrated to be immediately adjacent to peripheral circuitry 102; however, pixel circuitry 101 and peripheral circuit 102 may be separated by shallow trench isolations (STI) and/or a doped wells within epi layer 110, which isolate the pixel array from the rest of image sensor 100.

BSI image sensor 100 is photosensitive to light incident upon the backside of the sensor die. For BSI image sensors, the majority of photon absorption occurs near the backside silicon surface. To separate the electron-hole pairs created by photon absorption and drive the electrons to PD region 105, an electric field near the back silicon surface is helpful. This electric field may be created by doping the back surface and laser annealing. Laser annealing is an annealing process which creates localized heating.

For a thick P− epi layer 110, the laser pulse raises the back surface temperature greatly (e.g., in excess of 1000 C), but due to the short pulse, the temperature decreases quickly into the bulk of epi layer 110. However, when epi layer 110 is thin (e.g., P− epi layer 110<4 um thick), the insulation from interlayer dielectric layer 120 and the remainder of the back-end-of-the-line ("BEOL") elements may cause a significant increase in substrate and epitaxial layer temperature during laser annealing that can result in deleterious effects, such as dopant diffusion at temperatures greater than 800 C and/or BEOL metal deterioration/melting at temperatures greater than 400 C.

This problem may be solved by using a thicker final P−epi layer 110, which can be produced by removing less of the epi layer during the backside thinning process. Retaining a thick layer of silicon between the backside and the front side places the laser-irradiated high temperature back surface further away from the dopant profiles and metal/silicide contacts on the front side. However, increasing this thickness results in increased electrical crosstalk between adjacent pixels in an imaging sensor array. Therefore, the trend has been to make P− epi layer 110 thinner.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a system and method for fabricating a backside illuminated ("BSI") imaging sensor are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
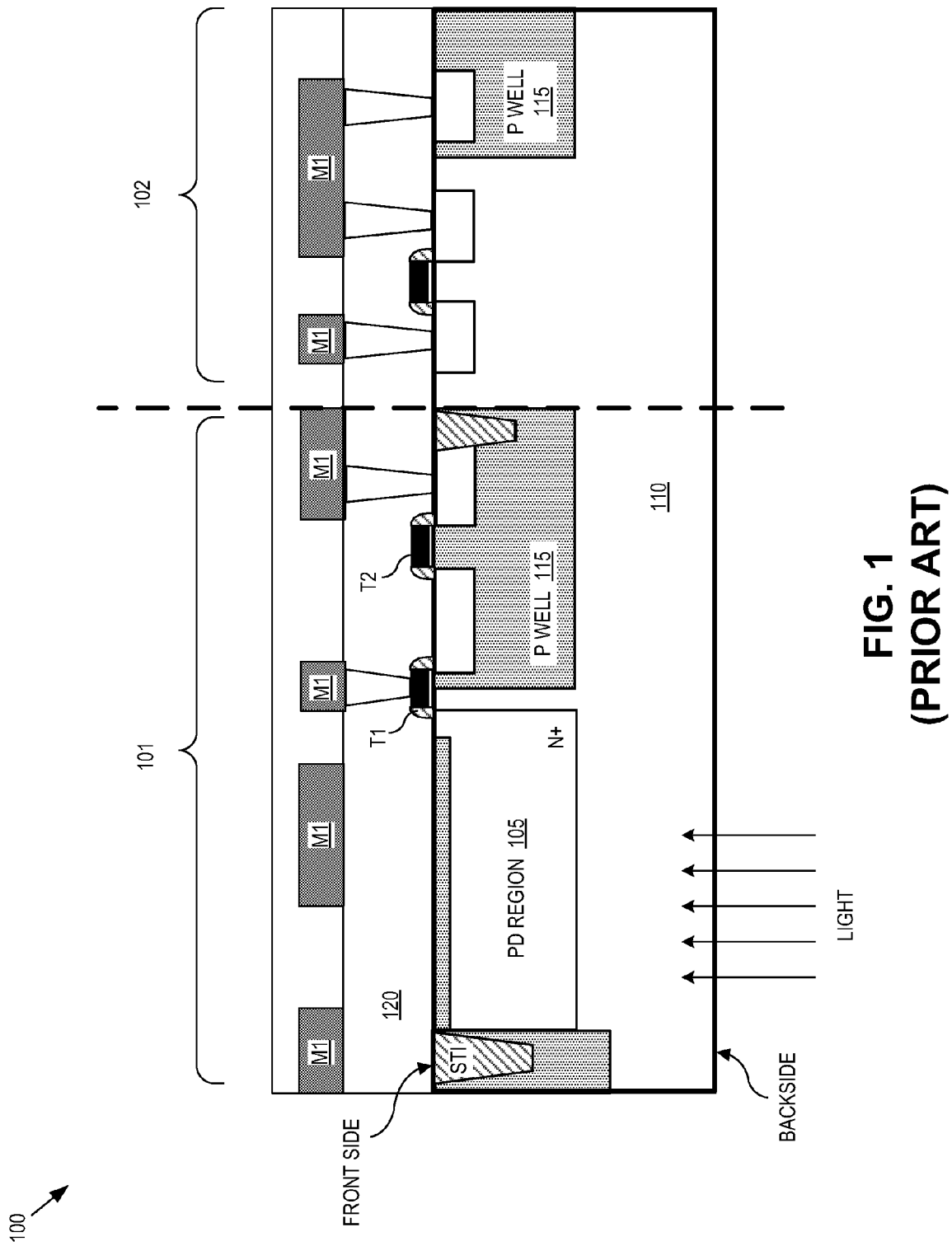
FIG. 1 (PRIOR ART) is a cross sectional view of a conventional backside illuminated image sensor.
Figure 2:
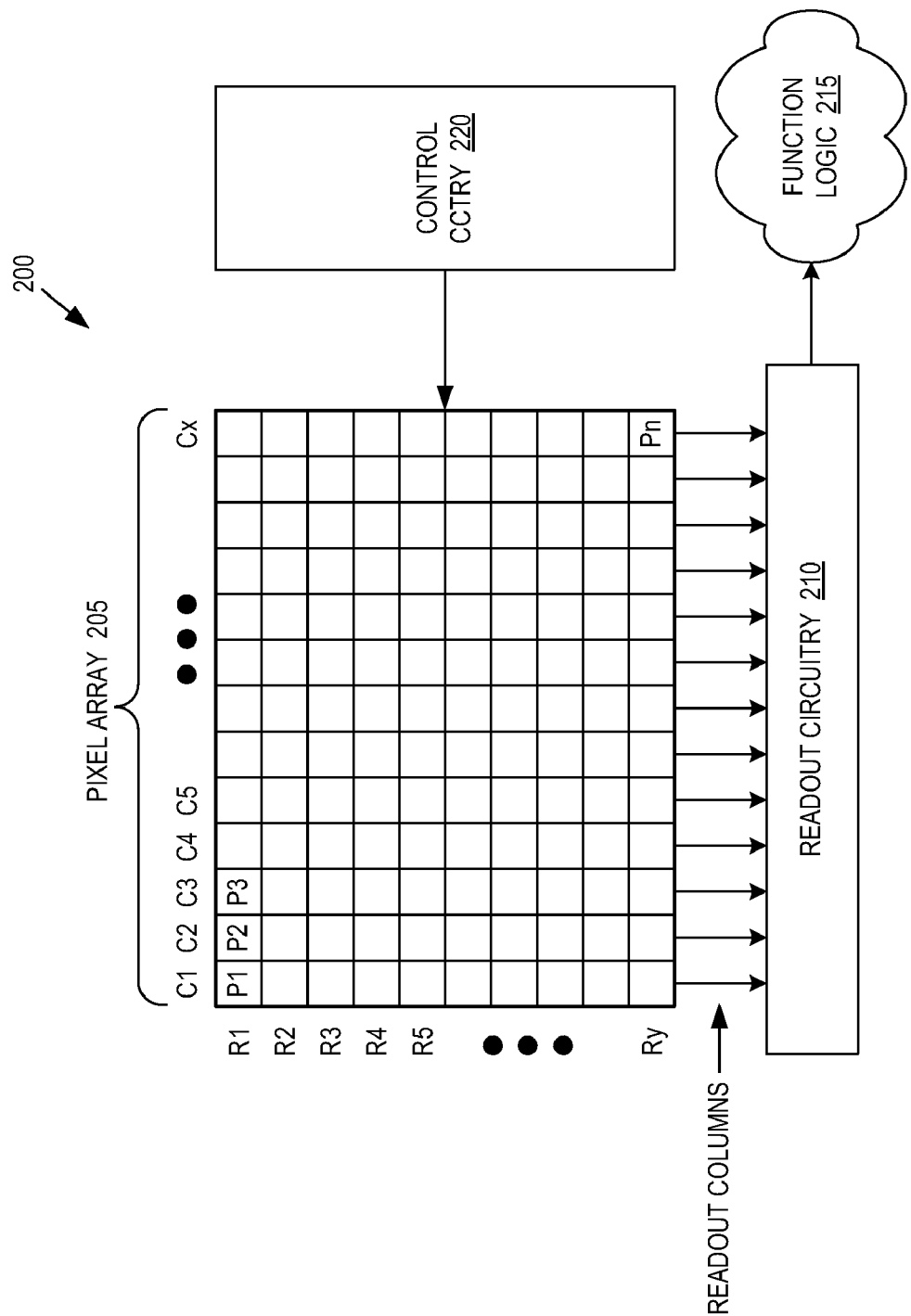
FIG. 2 is a block diagram illustrating a backside illuminated imaging system, in accordance with an embodiment of the invention.

FIG. 2 is a block diagram illustrating a BSI imaging system 200, in accordance with an embodiment of the invention. The illustrated embodiment of imaging system 200 includes a pixel array 205, readout circuitry 210, function logic 215, and control circuitry 220.

Pixel array 205 is a two-dimensional ("2D") array of backside illuminated imaging sensors or pixels (e.g., pixels P1, P2..., Pn). In one embodiment, each pixel is a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 210 and transferred to function logic 215. Readout circuitry 210 may include amplification circuitry, analog-to-digital ("ADC") conversion circuitry, or otherwise. Function logic 215 may simply store the image data or even manipulate the image data by applying post image effects (e.g., crop, rotate, remove red eye, adjust brightness, adjust contrast, or otherwise). In one embodiment, readout circuitry 210 may readout a row of image data at a time along readout column lines (illustrated) or may readout the image data using a variety of other techniques (not illustrated), such as a serial readout or a full parallel readout of all pixels simultaneously.

Control circuitry 220 is coupled to pixel array 205 to control operational characteristic of pixel array 205. For example, control circuitry 220 may generate a shutter signal for controlling image acquisition. In one embodiment, the shutter signal is a global shutter signal for simultaneously enabling all pixels within pixel array 205 to simultaneously capture their respective image data during a single acquisition window. In an alternative embodiment, the shutter signal is a rolling shutter signal whereby each row, column, or group of pixels is sequentially enabled during consecutive acquisition windows.

Figure 3:
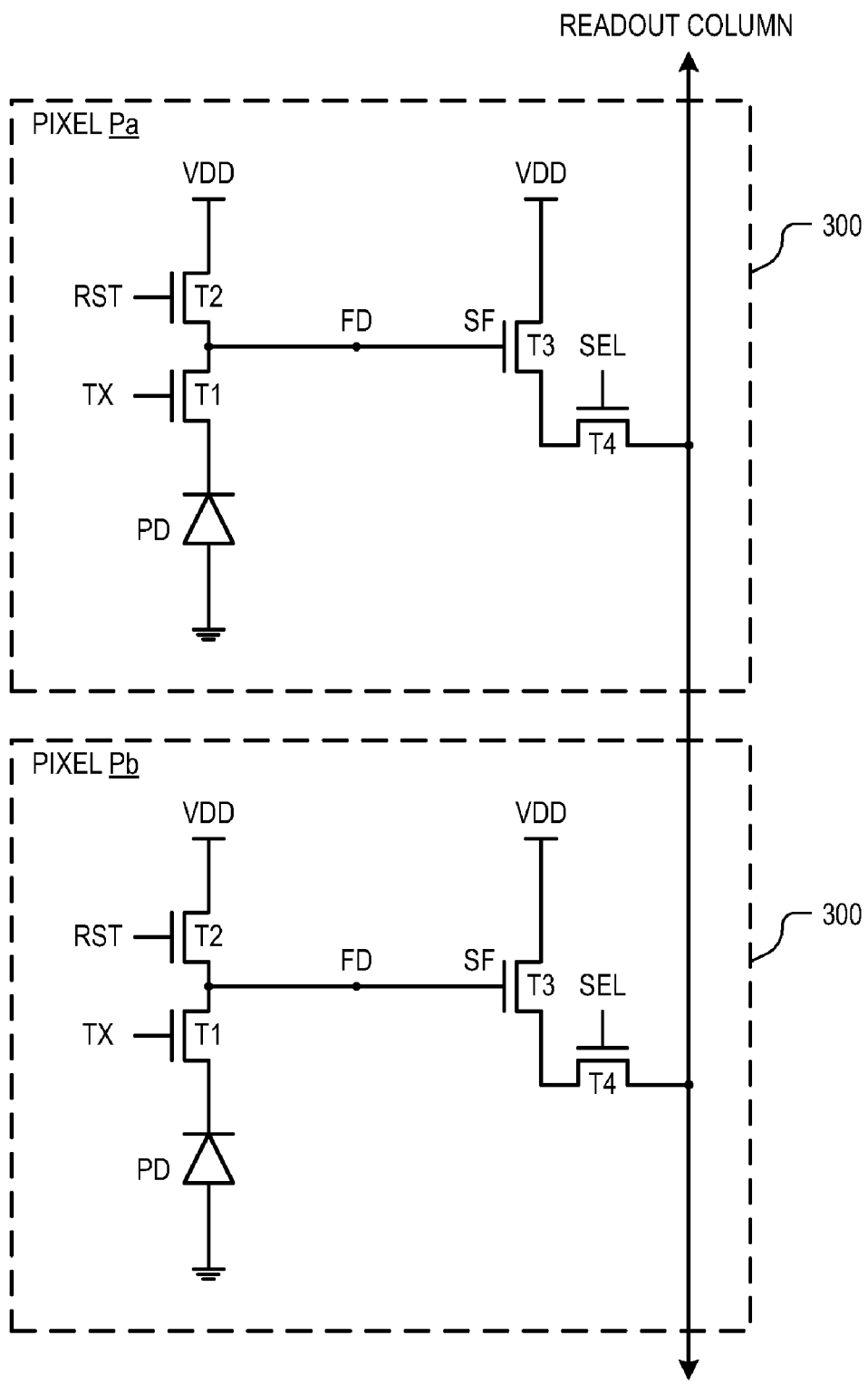
FIG. 3 is a circuit diagram illustrating pixel circuitry of two 4T pixels within a backside illuminated imaging system, in accordance with an embodiment of the invention.

FIG. 3 is a circuit diagram illustrating pixel circuitry 300 of two four-transistor ("4T") pixels within a BSI imaging array, in accordance with an embodiment of the invention. Pixel circuitry 300 is one possible pixel circuitry architecture for implementing each pixel within pixel array 200 of FIG. 2. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures. In FIG. 3, pixels Pa and Pb are arranged in two rows and one column. The illustrated embodiment of each pixel circuitry 300 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD. In one embodiment, floating diffusion node FD may be coupled to a storage capacitor for temporarily storing image charges. Reset transistor T2 is coupled between a power rail VDD and the floating diffusion node FD to reset (e.g., discharge or charge the FD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance output from the pixel. Finally, select transistor T4 selectively couples the output of pixel circuitry 300 to the readout column line under control of a select signal SEL. In one embodiment, the TX signal, the RST signal, and the SEL signal are generated by control circuitry 220.

Figure 4:
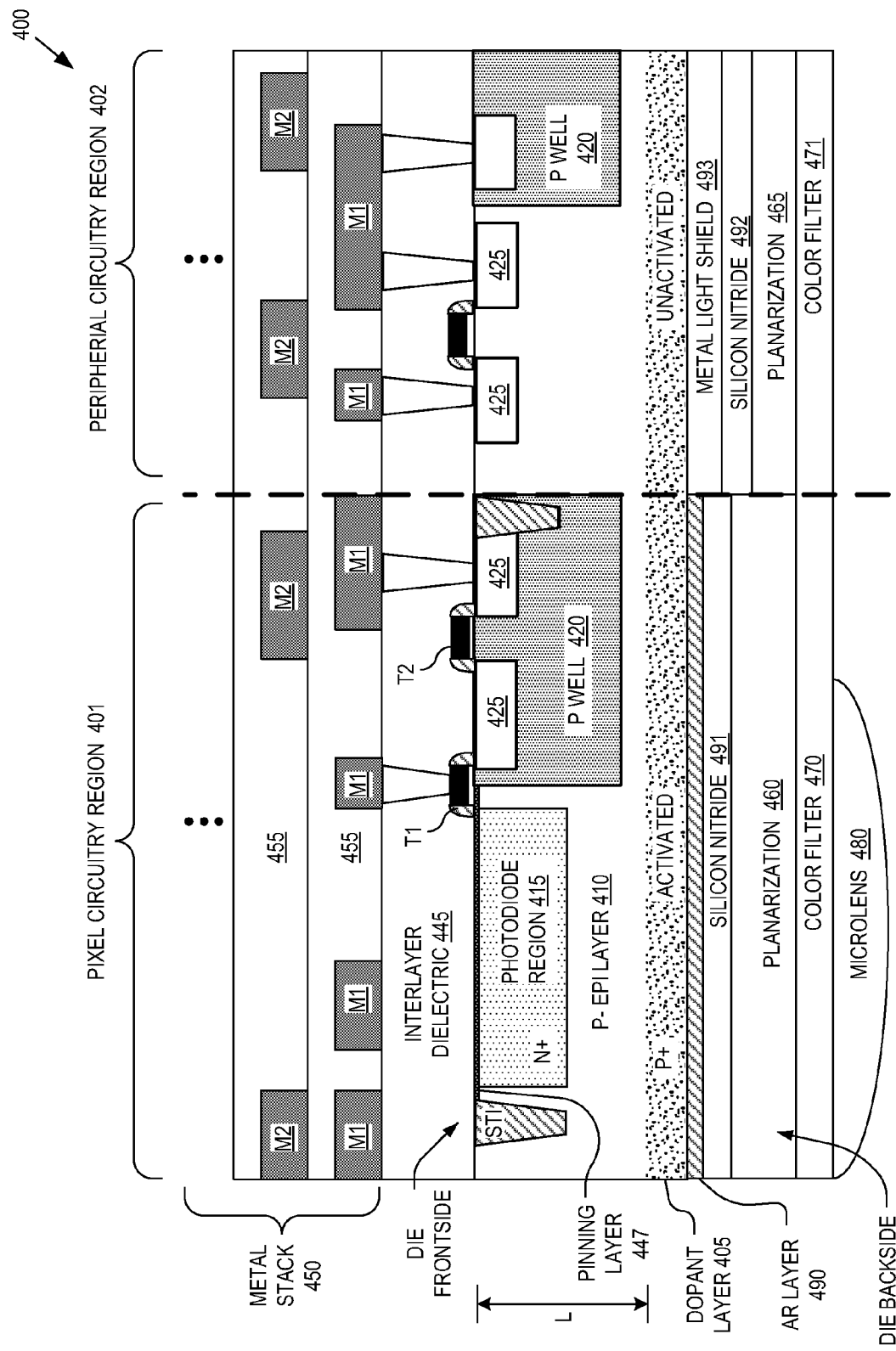
FIG. 4 is a cross sectional view of backside illuminated image sensor in accordance with an embodiment of the invention.

FIG. 4 is a cross sectional view of a BSI image sensor 400 including a pixel circuitry region 401 and a peripheral circuitry region 402 and having a laser annealed dopant layer 405 disposed on its backside, in accordance with an embodiment of the invention. Pixel circuitry region 401 includes circuitry and pixel elements for implementing the circuitry for pixels P1 to Pn within pixel array 205 of FIG. 2.

The illustrated embodiment of pixel circuitry region 401 includes P+ dopant layer 405, a P– epi layer 410, a photodiode region 415, a P well 420, N+ source/drain diffusions 425, pixel transistors (only transfer transistor T1 and reset transistor T2 are illustrated), an inter-layer dielectric layer 445, a P+ passivation or pinning layer 447, and a metal stack 450. The layers disposed on the die backside include planarization layers 460 and 465, color filters 470 and 471, microlens 480, anti-reflection layer 490, silicon nitride layers 491 and 492, and a metal light shield 493. The illustrated embodiment of metal stack 450 includes multiple metal layers (e.g. M1, M2, etc.) separated by inter-layer dielectrics 455, and interconnected with contacts. Although FIG. 4 illustrates only a two-layer metal stack, metal stack 450 may include more or less layers for routing signals over the front side of pixel array 205. Finally, a shallow trench isolation ("STI") isolates internal components of the illustrated pixel from adjacent pixels (not illustrated).

In FIG. 4, pixel circuitry region 401 is illustrated as immediately adjacent to peripheral circuitry region 402; however, pixel circuitry region 401 and peripheral circuit region 402 may be separated by one or more STI and/or doped wells disposed within epi layer 410 which isolate the pixel array from the rest of image sensor 400. In one embodiment, peripheral circuitry region 402 includes circuitry for implementing readout circuitry 210, control circuitry 220, and otherwise, but excludes at least the transistors T1-T4 and photodiode PD illustrated in FIG. 3.

Figure 5:
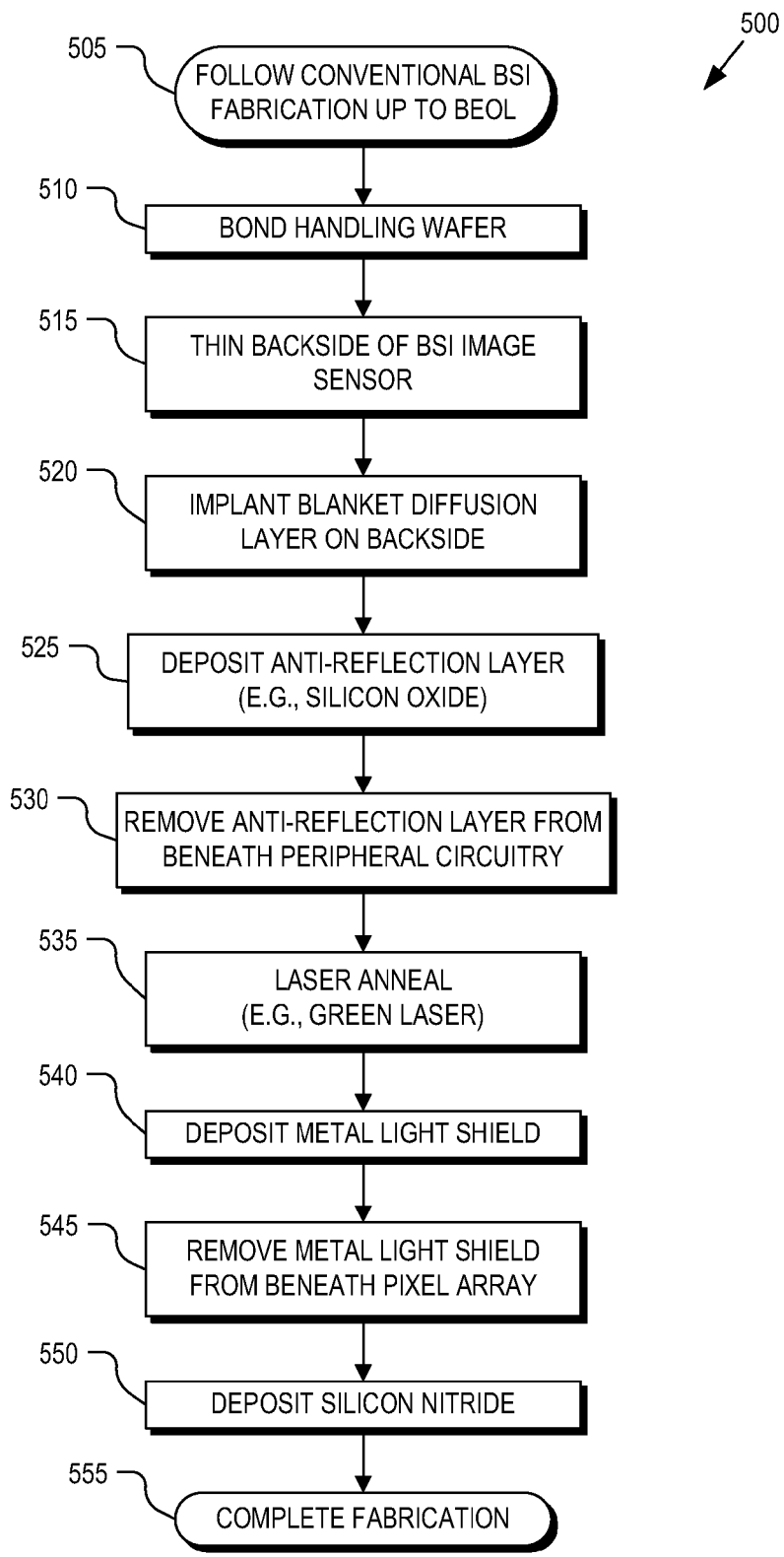
FIG. 5 is a flow chart illustrating a process for fabricating a backside illuminated image sensor in accordance with an embodiment of the invention.

FIG. 5 is a flow chart illustrating a process 500 for fabricating BSI image sensor 400, in accordance with an embodiment of the invention. Process 500 is described with reference to FIGS. 6A-6E. The order in which some or all of the process blocks appear in process 500 should not be deemed limiting. Rather, one of ordinary skill in the art having the benefit of the present disclosure will understand that some of the process block may be executed in a variety of orders not illustrated.

Figure 6A:
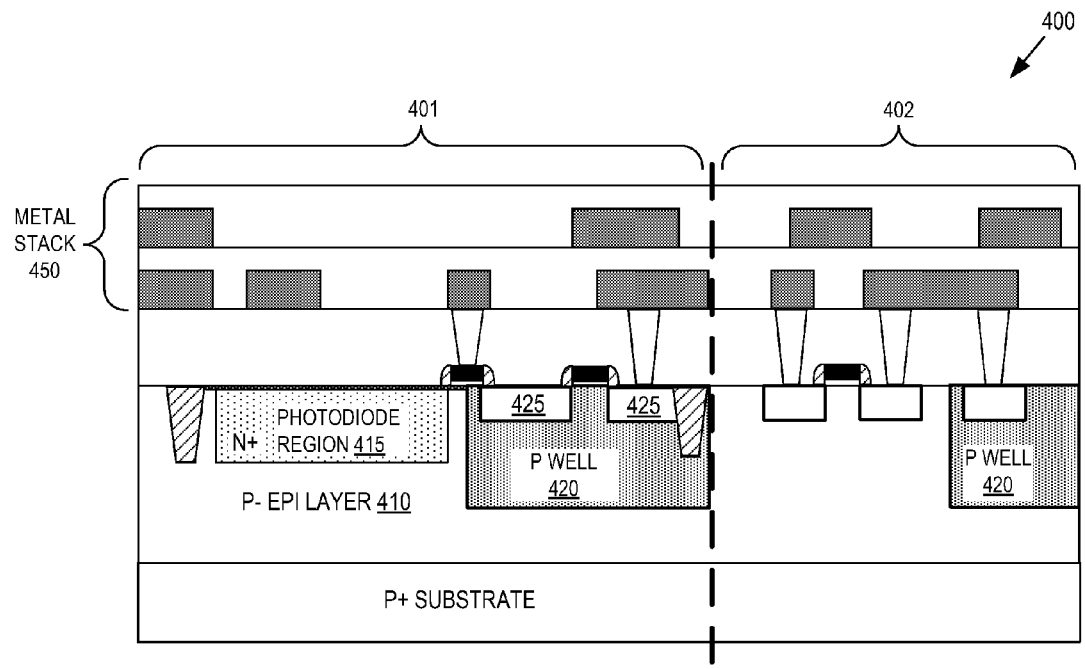
FIG. 6A is a cross sectional view of a partially fabricated backside illuminated imaging sensor fabricated up to completion of the BEOL, in accordance with an embodiment of the invention.

In process block 505, fabrication of image sensor 400 follows conventional techniques right up to fabrication of the back-end-of-the-line ("BEOL") components including diffusion implants, silicides, pixel transistor circuitry and metal stack 450 (see FIG. 6A). In process block 510, a handle wafer is bonded to the front side of BSI image sensor 400 over metal stack 450.

In a process block 515, image sensor 400 is backside thinned to remove the P+ substrate and expose P– epi layer 410. Backside thinning may be performed with a combination of chemical mechanical polishing ("CMP") and chemical etching.

Figure 6B:
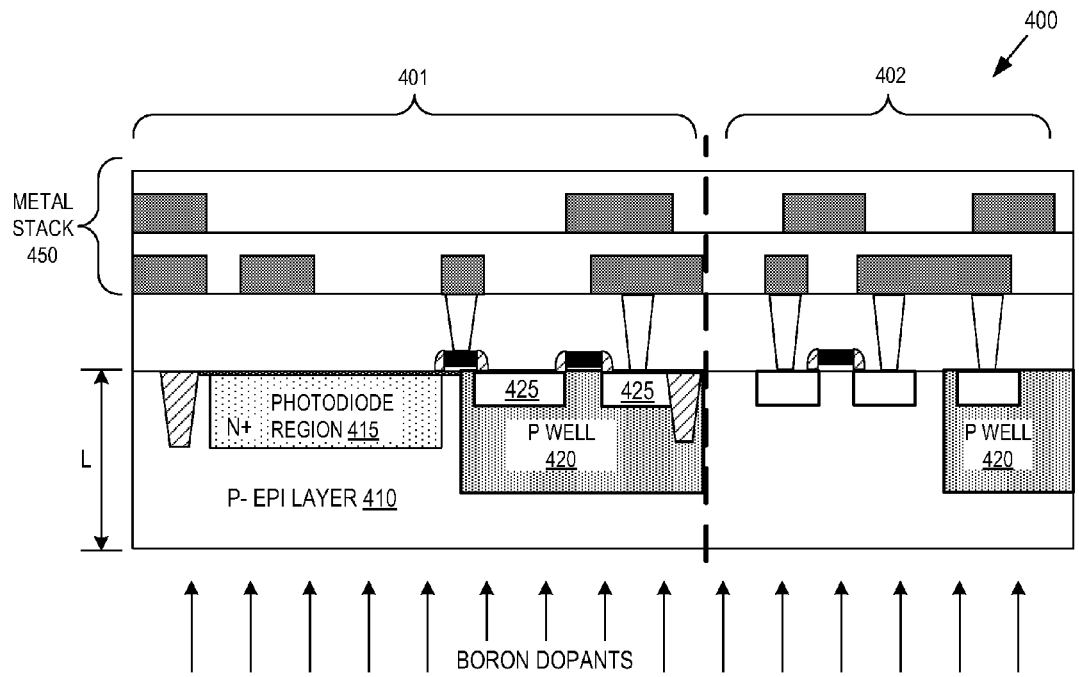
FIG. 6B is a cross sectional view of a partially fabricated backside illuminated imaging sensor illustrating a dopant layer implant on the backside, in accordance with an embodiment of the invention.
Figure 6C:
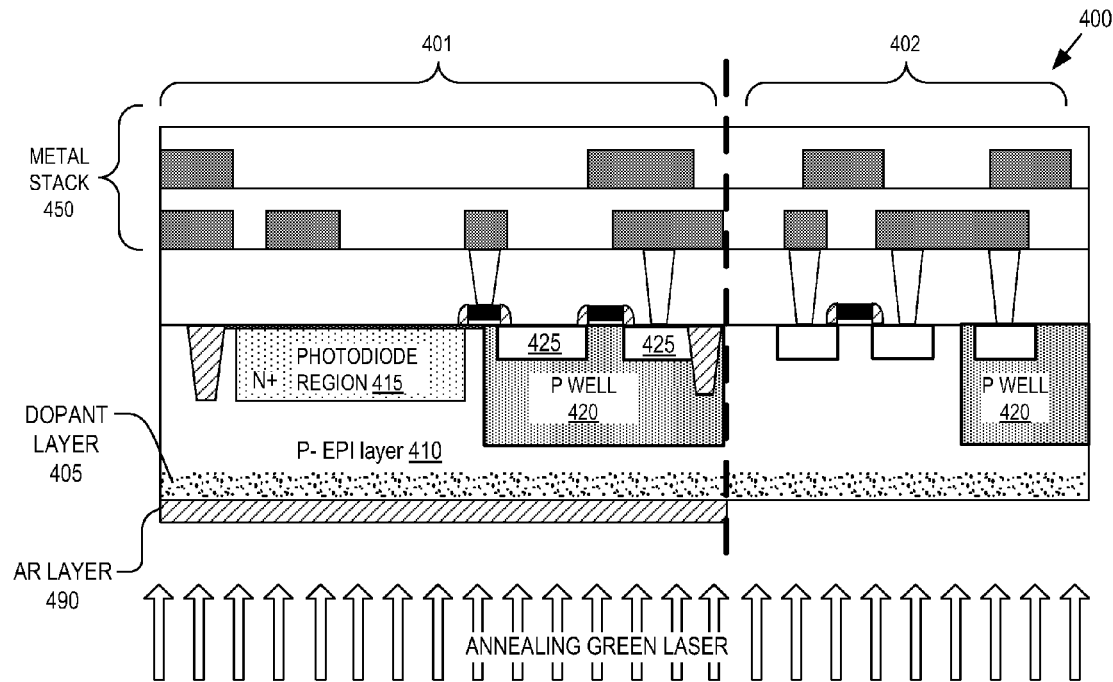
FIG. 6C is a cross sectional view of a partially fabricated backside illuminated imaging sensor illustrating a laser anneal process on the backside, in accordance with an embodiment of the invention.
Figure 6D:
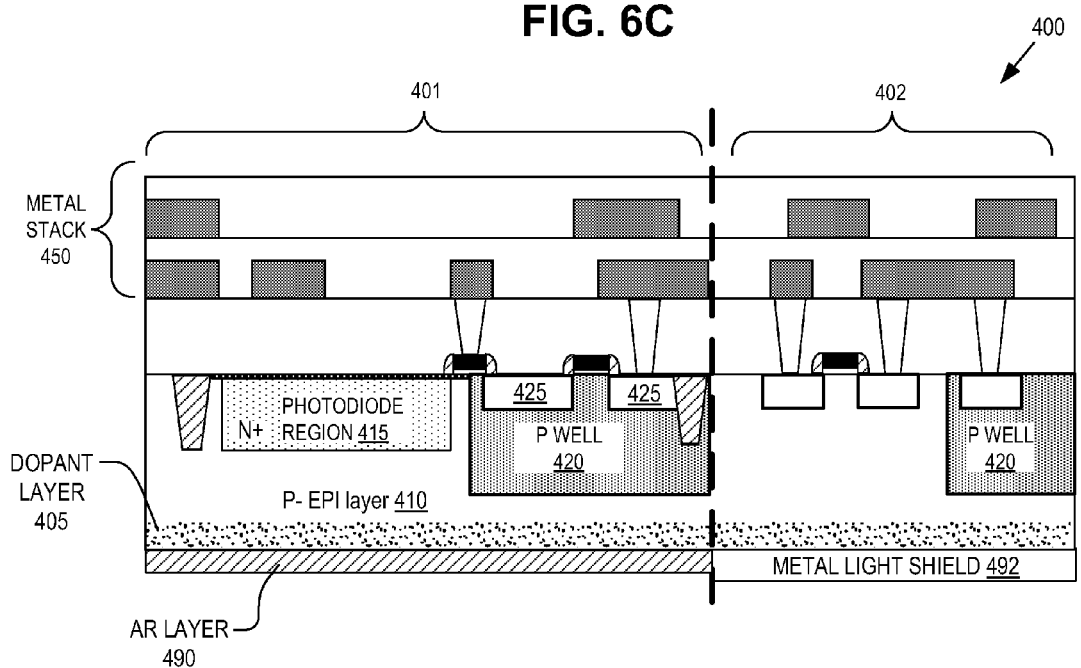
FIG. 6D is a cross sectional view of a partially fabricated backside illuminated imaging sensor illustrating a formation of a metal light shield, in accordance with an embodiment of the invention.
Figure 6E:
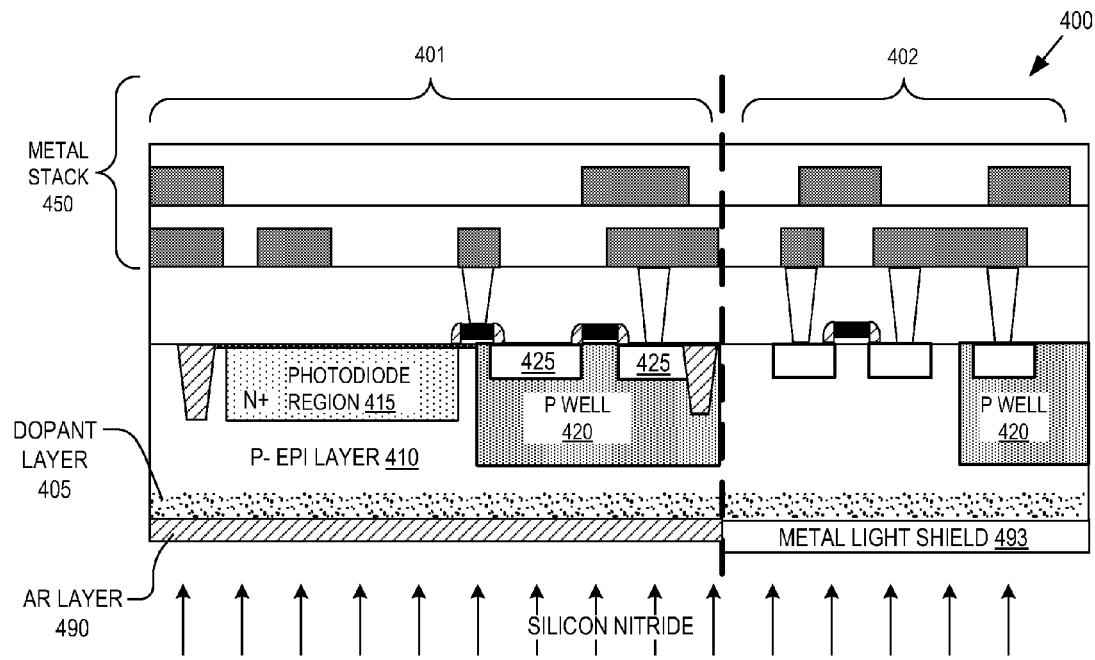
FIG. 6E is a cross sectional view of a partially fabricated backside illuminated imaging sensor illustrating deposition of a silicon nitride layer on the backside, in accordance with an embodiment of the invention.

In a process block 520, dopant layer 405 is implanted into the backside of image sensor 400 as a blanket P+ dopant layer (see FIG. 6B). In one embodiment, boron is implanted into the backside surface using established ion implantation techniques. Dopant layer 405 creates a dopant gradient which provides a vertical electrical force for pushing photo-generated electrons vertically towards to the collecting depletion region of photodiode region 415. Additionally, dopant layer 405 passivates the backside surface of P− epi layer 410 and thereby prevents leakage current from the back surface from entering N+ photodiode region 415.

In standard BSI fabrication processes using backside implants, a dopant implant is usually followed by a laser anneal to activate the dopants. During the laser anneal, the temperature of the annealed surface can rise well above 1000 C, depending on the laser wavelength, power, penetration depth, and pulse time. However, the temperature is expected to drop within the semiconductor material (e.g., silicon) due to heat diffusion into the bulk. A BSI structure is basically a semiconductor-on-insulator ("SOT") device, since the silicon active region is isolated from a larger bulk silicon substrate by the BEOL dielectric layers. When the silicon active region is thick (L>4 µm), the distance between the back surface and front surface is large enough so that the front surface temperature is significantly lower than the back surface temperature. For example, if the back surface temperature rises to >1000 C, the front surface temperature should still be below 400 C. However, thick silicon increases electrical crosstalk between adjacent pixels. Photo-electrons created near the back surface experience a vertical force towards the front surface due to the back surface P+ doping (i.e., dopant layer 405). In addition to vertical motion created, the electrons move laterally due to diffusion. The further an electron has to travel to the photodiode collection region, the higher the probability that it will diffuse laterally into a neighboring pixel, a phenomena know as electrical crosstalk. Accordingly, the trend in BSI technology is therefore towards thinner silicon thickness (L<4 um) to reduce electrical crosstalk. Reducing the silicon thickness introduces process complexities in terms of laser annealing the backside dopant layer 405.

During laser anneal, the metal leads and contacts in the pixel and peripheral circuitries are exposed to laser anneal-related heat resulting in possible degradation. The metal leads and contacts in pixel circuitry region 401 typically do not carry as much current as the typical metal leads in peripheral circuitry region 402. Thus, pixel circuitry region 401 can withstand greater heat stress degradation (e.g., damage causing increased resistance) than peripheral circuitry region 402, since the resulting increased lead resistance has less effect at lower currents.

In experiments it was found that less laser power is required to achieve the same backside annealed characteristics when a dual purpose anti-reflection and thermal insulating layer (e.g., oxide or silicon oxide) is deposited over dopant layer 405 prior to the laser anneal. Accordingly, in process block 525, approximately 200 Angstroms±100 Angstroms of anti-reflection layer 490 (e.g., silicon oxide) is deposited on the backside surface of image sensor 400. In process block 530, anti-reflection layer 490 is removed from a portion of the backside adjacent to or beneath peripheral circuitry 402 using photo-patterning (see FIG. 6C). In one embodiment, anti-reflection layer 490 forms a single contiguous blanket layer beneath pixel array 205.

In process block 535, the backside surface of image sensor 400 is annealed with a laser (e.g., green wavelength laser). Anti-reflection layer 490 operates as both an anti-reflective film facilitating greater laser penetration into dopant layer 405 and a thermal blanket over dopant layer 405 in the region under pixel circuitry 401 reducing heat dissipation out the backside. As such, less power (e.g., less laser intensity or shorter laser pulses compared to the intensity or pulse durations required to laser anneal dopant layer 405 without the presence of anti-reflection layer 490) can achieve the requisite heat to anneal dopant layer 405 under pixel circuit region 401. However, because anti-reflection layer 490 is removed from dopant layer 405 under peripheral circuitry region 402, greater laser power is reflected off the backside surface in this region and greater heat dissipation can radiate out the backside surface in this region, thereby lowering the localized temperature during the anneal processes, and resulting in less laser-anneal-related heat damage to peripheral circuitry region 402.

Removing the oxide from peripheral circuitry region 402 prior to the laser anneal of dopant layer 405 appears to provides a number of advantages. The amount of energy absorbed by the silicon is reduced, thereby reducing the temperature rise of the exposed die portion. There are typically no metal/silicide contacts above photodiode region 415 and therefore the front surface can tolerate a larger temperature rise than regions with metal contacts. Metal contacts will typically degrade above 400 C, but dopant profiles typically do not diffuse below 800 C. In some embodiments, metal light shield 493 is applied prior to the laser anneal thereby further protecting peripheral circuitry region 402 from the harmful effects of the high temperature anneal process. Additionally, metal light shield 493 blocks the laser and inhibits the portion of dopant layer 405 behind metal light shield 493 from being activated. The unactivated portion of dopant layer 405 results in a high recombination zone. Electrons that migrate to or are formed in this region will more easily recombine thereby reducing crosstalk.

In process block 540, a metal light shield 493 is deposited across the backside of image sensor 400. In process block 545, metal light shield 493 is removed from under pixel circuitry region 401 (see FIG. 6D), leaving metal to block light from entering periphery circuitry and dark current reference cells. In process block 550, silicon nitride is deposited across the backside of the die (FIG. 6E) forming silicon nitride layers 491 and 492 (see FIG. 6F).

While the thickness of anti-reflection layer 490 alone (e.g., 300 Angstroms) operates to improve the transmission of a green annealing laser, it is also selected so that when combined with silicon nitride layer 491, a broadband antireflective multi-layer structure results. In one embodiment, the antireflective multi-layer structure is designed for the RGB visible spectrum of typical incident image light during operation of image sensor 400.

Figure 6F:
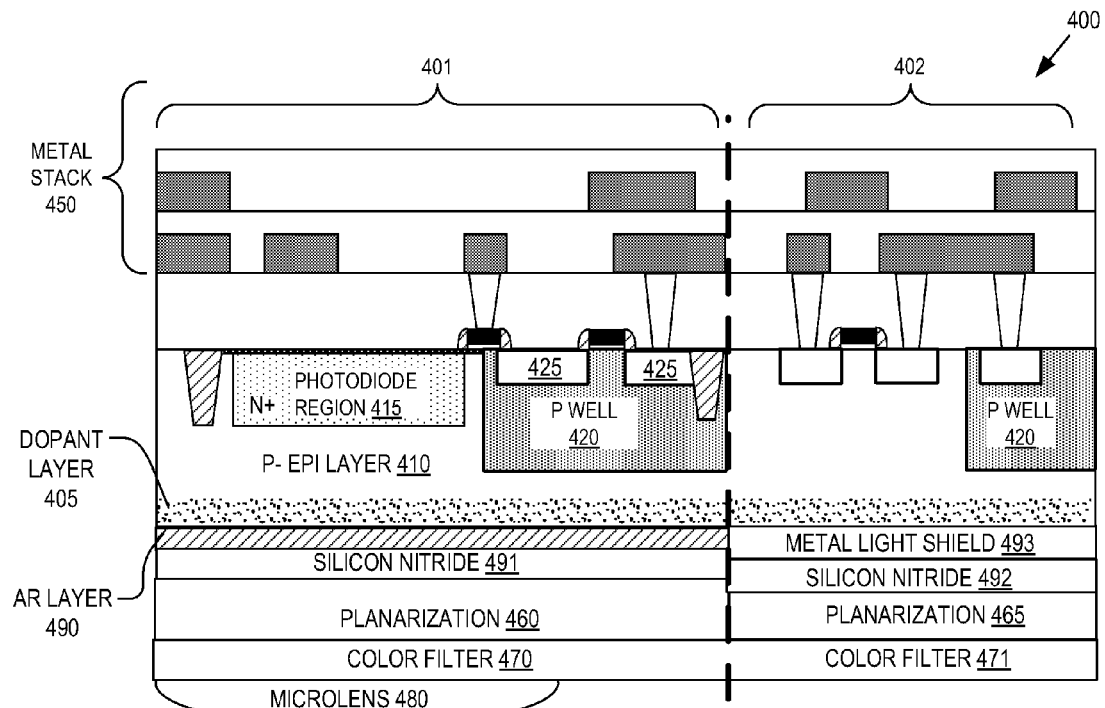
FIG. 6F. is a cross sectional view of a completely fabricated backside illuminated imaging sensor.

In process block 555, fabrication of image sensor 400 is completed with the addition of planarization layers 460 and 465, color filters 470 and 471 and microlens 480 (see FIG. 6F). Note, FIGS. 4 and 6A-6F only illustrate the cross-section of a single pixel within pixel array 205. Accordingly, fabrication of imaging system 200 would include fabrication of an array of color filters 470 and 471 and an array of microlenses 480 though embodiments of anti-reflection layer 490, silicon nitride layers 491 and 492, and metal light shield 493 may be blanket layers shared by multiple repeated devices.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method of fabricating an image sensor including a pixel circuitry region and a peripheral circuitry region, the method comprising:
   fabricating front side components on or in a front side of the image sensor;
   implanting a dopant layer on a backside of the image sensor;
   forming an anti-reflection layer on the backside that covers a first portion of the dopant layer under the pixel circuitry region while exposing a second portion of the dopant layer under the peripheral circuitry region; and
   laser annealing the first portion of the dopant layer from the backside of the image sensor through the anti-reflection layer, wherein the anti-reflection layer increases penetration of an annealing laser into the first portion of the dopant layer while reducing a first heat dissipation rate out the backside of the image sensor from the first portion of the dopant layer during the laser annealing relative to a second heat dissipation rate out the backside of the image sensor from the second portion of the dopant layer during the laser annealing.

2. The method of claim 1, wherein at least one of a laser intensity or a laser pulse duration of the laser annealing is reduced below a level required to laser anneal the dopant layer had the anti-reflection layer not been present.

3. The method of claim 2, wherein the anti-reflection layer increases a first temperature of the first portion of the dopant layer during the laser annealing compared to a second temperature of the second portion of the dopant layer not covered by the anti-reflection layer resulting in less thermal damage to first frontside circuitry in the peripheral circuitry region than to the second frontside circuitry in the pixel circuitry region.

4. The method of claim 1, further comprising forming a silicon nitride layer over the anti-reflection layer, wherein thicknesses of the anti-reflection layer and the silicon nitride layer are selected such that the anti-reflection layer alone operates to increase transmission of the annealing laser while a combination of the anti-reflection layer and the silicon nitride layer form a multi-layer anti-reflective structure for improving transmission of broadband visible spectrum light incident on the backside of the image sensor during operation of the image sensor.

5. The method of claim 4, wherein the anti-reflection layer is between 100 Angstroms and 300 Angstroms thick.

6. The method of claim 1, wherein the laser annealing comprises laser annealing with a green wavelength laser.

7. The method of claim 1, wherein the pixel circuitry region comprises a first portion of the die including an array of imaging pixels and wherein the peripheral circuitry region comprises a second portion of the die not including the array of imaging pixels.

8. The method of claim 1, wherein the anti-reflection layer comprises silicon oxide.

9. The method of claim 1, further comprising forming a metal light shield over the second portion of the dopant layer under the peripheral circuitry region.

10. The method of claim 1, wherein fabricating the front side components comprises:
    forming an epitaxial layer over a semiconductor substrate;
    forming photodiode regions and associated pixel circuitry on or within a front side of the epitaxial layer within the pixel circuitry region;
    forming a metal stack over the front side of the epitaxial layer; and
    removing the semiconductor substrate from a backside of the epitaxial layer.

11. The method of claim 10, further comprising thinning the epitaxial layer from the backside until the epitaxial layer is less than or equal to 4 µm thick.

12. The method of claim 11, further comprising:
    forming an array of microlens over the backside under the pixel circuitry region.

13. The method of claim 12, wherein the image sensor comprises backside illuminated complementary metal-oxide semiconductor (CMOS) image sensor.

* * * * *